United States Patent [19]

Yukawa

[11] Patent Number: 4,511,810

[45] Date of Patent: Apr. 16, 1985

[54] VOLTAGE COMPARATOR CIRCUIT

[75] Inventor: Akira Yukawa, Tokyo, Japan

[73] Assignee: Nippon Electric Co., Ltd., Tokyo, Japan

[21] Appl. No.: 414,724

[22] Filed: Sep. 3, 1982

[30] Foreign Application Priority Data

Sep. 3, 1981 [JP] Japan .................. 56-138946

[51] Int. Cl.³ .................. H03K 5/24; H03K 3/353
[52] U.S. Cl. .................. 307/355; 307/279; 307/362; 307/530
[58] Field of Search ............. 307/355, 362, 279, 530

[56] References Cited

U.S. PATENT DOCUMENTS

| | | | |
|---|---|---|---|
| 4,031,415 | 6/1977 | Redwine et al. | 307/279 |
| 4,136,292 | 1/1979 | Suzuki et al. | 307/355 |
| 4,181,865 | 1/1980 | Kohyama | 307/530 |
| 4,247,791 | 1/1981 | Rovell | 307/355 |
| 4,333,020 | 1/1982 | Maeder | 307/279 |

Primary Examiner—John Zazworsky
Attorney, Agent, or Firm—Sughrue, Mion, Zinn, Macpeak, and Seas

[57] ABSTRACT

A voltage comparator circuit which can operate stably without being affected by in-phase noise and can be fabricated with a small number of circuit elements is disclosed. The comparator circuit comprises a differential amplifier having a pair of input transistors of a first conductivity type, a latch circuit having a pair of latch transistors of a second conductivity type whose gates and drains are cross-coupled at a pair of output terminals of the differential amplifier, and means for controlling a potential at commonly connected source of the latch transistors.

18 Claims, 9 Drawing Figures

VOLTAGE COMPARATOR CIRCUIT

BACKGROUND OF THE INVENTION

The present invention relates to a voltage comparator circuit for comparing two voltages having a small difference in value therebetween.

In a conventional voltage comparator circuit fabricated in a semiconductor integrated circuit of a complementary MOS (CMOS) structure employing both of N-channel transistors and P-channel transistors, a two-stage amplification structure is employed in which a differential amplifier receives a pair of input voltage signals to be compared and an inverting amplifier amplifies the output voltage of the differential amplifier. Although two two-stage amplification structure realizes an amplification factor which is usually 2000 to 5000, it is usually provided with one more inverting amplifier so as to establish margin in the amplification. In such a voltage comparator circuit, it is necessary to increase the number of amplification stages in accordance with a decrease in an input voltage difference. This causes an increase in the area occupied by the amplifiers in the integrated circuit, and also an increase in the power consumption. Moreover, an in-phase voltage may not be perfectly removed by the differential amplifier in the first stage. When an in-phase voltage component of the input voltage varies in the case where an input voltage difference is not more than several mV, an output voltage from the differential amplifier varies, and such an output voltage is then amplified by the inverting amplifier. Consequently, in an output signal from the final stage, the logic "1" state and logic "0" state are erroneously exchanged in some cases when an inphase voltage is at a certain level. The same phenomenon occurs when a power source voltage varies. Therefore, it is impossible for a voltage comparator circuit to determine a voltage difference of not more than several mV.

SUMMARY OF THE INVENTION

An object of the present invention is to provide a voltage comparator circuit having an extremely high sensitivity without being affected by in-phase noise and formed with a smaller number of elements.

The comparator circuit according to the present invention includes a differential amplifier circuit having a pair of differential input transistors of a first conductivity type and a pair of load transistors of a second conductivity type; a pair of latch transistors of the second conductivity type having drains and gates cross-coupled; means for connecting a pair of cross-coupled nodes of the latch transistors to a pair of output terminals of the differential amplifier circuit; and means for controlling an electric potential at the commonly connected sources of the latch transistors.

According to one aspect of the present invention, there is provided a voltage comparator circuit comprising first and second power source terminals, a pair of differential input transistors of a first conductivity type, current source connected between commonly connected sources of the differential input transistors and the first power source terminal, a pair of load transistors of a second conductivity type forming a current mirror circuit and connected between the second power source terminal and drains of the differential input transistors, a pair of latch transistors of the second conductivity type having cross-coupled drains and gates at a pair of nodes, a means for respectively connecting the nodes to drains of the differential input transistors, a first switch transistor of the second conductivity type connected between the commonly connected sources of the latch transistors and the second power source terminal, a second switch transistor of the second conductivity type connected between the pair of nodes, a means for periodically making the first switch transistor conducting, and a means for making the second switch transistor conducting periodically in a phase different from the phase for the first switch transistor.

According to the present invention, signals from a pair of output terminals of the differential amplifier circuit are supplied to a latch circuit, in which the signals are further differentially amplified and reliably held. Thus, even when in-phase noise is superposed on a pair of input voltage signals, the noise is effectively deleted by the latch circuit, and an operation for comparing two voltage signals can be carried out accurately.

According to the present invention, the conductivity type of the differential input transistors and the conductivity type of the latch transistors are different from each other. Therefore, the level at one of the pair of nodes of the latch circuit is not shifted by the pair of differential input transistors in the direction of the electric potential of the first power source terminal, so that the electric potentials of the pairs of nodes can be retained stably during a latch period.

In order to set the electric potentials at the first and second power source terminals of the voltage comparator circuit according to the present invention described above, when the electric potential of the first power source terminal has a positive polarity with respect to the electric potential of the second power source terminal, P-channel transistors are used for the above-mentioned first conductivity type transistors, and N-channel transistors are used for the above-mentioned second conductivity type transistors. In the comparator circuit formed in the above-mentioned manner, one of the pair of nodes to which a differential input transistor of a P-channel type is connected, is kept at a high level since the electric charge is supplied from the source, the mentioned P-channel differential input transistor only toward the drain thereof connected to the node in question. The above two differential input transistors do not form a charge supply path between the pair of nodes. Accordingly, the electric potentials at the pair of nodes can be maintained stably during a latch period.

When the potential at the first power source terminal has a negative polarity with respect to the electric potential at the second power source terminal, N-channel transistors are used for the mentioned first conductivity type transistors, and P-channel transistors are used for the mentioned second conductive type transistors. In this case, one of the pair of nodes of the latch transistors, which has a lower electric potential, is connected to a N-channel differential input transistor and the negative electric charge is constantly supplied from only the first power source terminal through the N-channel transistor. Accordingly, the low electric potential at the mentioned one node can be maintained stably. At the same time, the negative charge is supplied from the first power source terminal to the drains of the two differential transistors. In other words, the electric current is supplied from the pair of nodes toward the first power source terminal only, so that the pair of differential input transistors do not form a current path between the pair of nodes. Therefore, the electric potentials in the pair of nodes can be maintained reliably.

According to another aspect of the present invention, there is provided a voltage comparator circuit comprising a power source terminal, a reference voltage terminal, a pair of P-channel differential input transistors, a P-channel current source transistor connected between commonly connected sources of the differential input transistors and the power source terminal, a pair of N-channel load transistors provided between the drains of the differential input transistors and the reference voltage terminal, a pair of nodes, a pair of N-channel latch transistors having drains and gates cross-connected to each other at the pair of nodes, an N-channel latch control transistor connected between commonly connected sources of the latch transistors and the reference voltage terminal, and a means for connecting the pair of nodes to drains of the pair of differential input transistors.

DETAILED DESCRIPTION OF THE PREFERRED EMBODIMENTS

Figure 1:
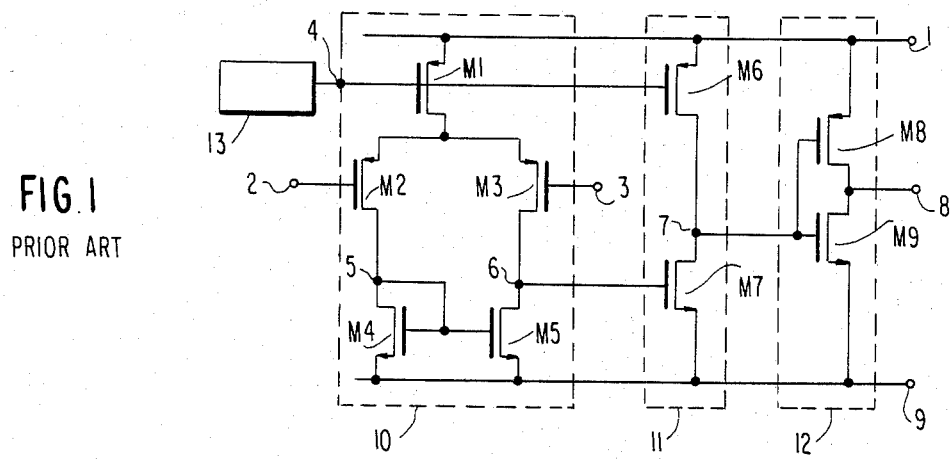
FIG. 1 shows a conventional voltage comparator circuit using a differential amplifier and inverting amplifiers.

A voltage comparator circuit according to the prior art will be explained with reference to FIG. 1. The comparator circuit is composed of a differential amplifier 10 and inverting amplifiers 11 and 12. The differential amplifier circuit includes as shown in FIG. 1 a P-channel field effect transistor (FET) M1 serving as a constant current source, P-channel FET's M2 and M3 serving as differential input transistors, and N-channel FET's M4 and M5 forming a current mirror type load circuit. In the amplifier circuit 10, an output voltage proportional to a difference between input voltages applied to input terminals 2 and 3 is extracted from a terminal 6, and then amplified by the inverting amplifier 11 having a P-channel FET M6 serving as a constant current load, and the inverting amplifier 12 having a P-channel FET M8 and an N-channel FET M9.

Figure 2A:
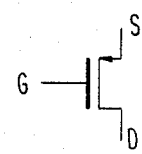
FIGS. 2a and 2b illustrate symbols of transistors used in the accompanying drawings.
Figure 2B:
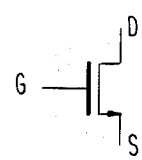

Here, a P-channel transistor and an N-channel transistor used in the present invention are designated by symbols shown in FIGS. 2a and 2b, respectively. In both symbols, reference letter G denotes a gate, S a source, and D a drain. Although an amplification factor of 2000 to 5000 is obtained through the differential amplifier 10 and the amplifier 11, it is usually provided with one more inverting amplifier 12 so as to obtain a margin in the amplification. A bias voltage supplying circuit 13, which is adapted to operate the FET's M1 and M6 in a constant current region, is structural with, for example, a circuit shown in FIG. 3. The bias voltage circuit shown in FIG. 3 consists of P-channel FET's M31 and M32 and an N-channel FET M33 which are connected in series between the power voltage terminals 1 and 9. The gate electrodes of the respective FET's are connected to their respective drain electrodes. The bias voltage circuit is adapted to divide the power source voltage applied between the terminals 1 and 9. In the voltage comparator circuit shown in FIG. 1, it is necessary to increase the number of amplifying stages in accordance with a decrease in an input voltage difference. This causes increase in the area occupied by the amplifiers in the integrated circuit, and also increase in the power consumption. Moreover, an in-phase voltage on the pair of input voltages may not be perfectly removed by the differential amplifier 10. When an inphase voltage component of an input voltage varies in the case where an input voltage difference is not more than several mV, an output voltage from the differential output terminal 6 varies, and the output voltage is then amplified by the inverting amplifiers 11 and 12. Consequently, in an output from a final stage, the logic "1" state and logic "0" state are erroneously exchanged in some cases when an inphase voltage amounts to a certain level. The same phenomenon occurs when a power source voltage varies. Therefore, it is impossible in such a voltage comparator circuit to determine a voltage difference of not more than several mV.

Figure 4:
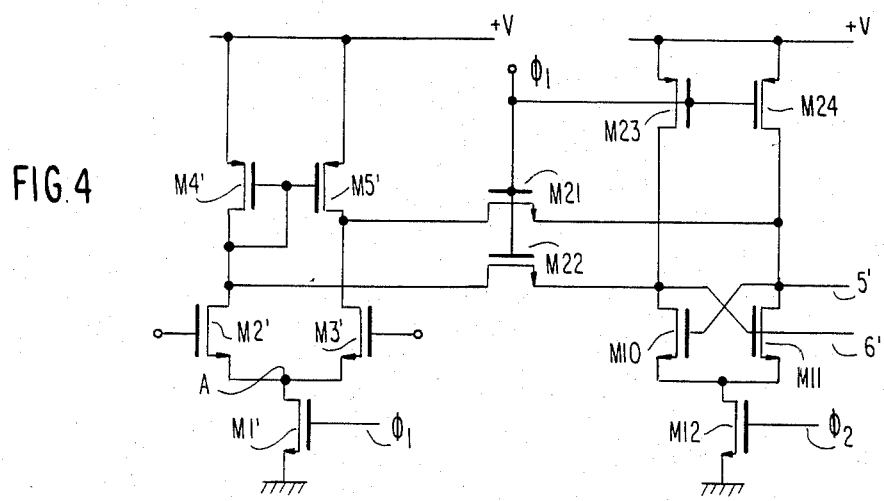
FIG. 4 illustrates an improved example of a voltage comparator circuit.
Figure 5:
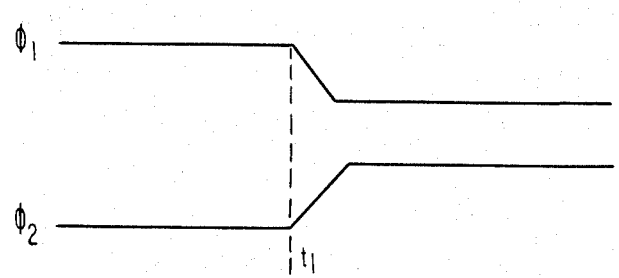
FIG. 5 is a diagram showing wave forms in the voltage comparator circuit shown in FIG. 4.

The above-mentioned drawbacks can be eliminated by a circuit shown in FIG. 4, in which the techniques of N-channel MOS IC are utilized. This circuit consists of a differential amplifier having N-channel FET's M1', M2' and M3' and P-channel FET's M4' and M5' and using the N-channel FET's M2', M3' having a large Gm as driver transistors; and a circuit having a strobed flip-flop formed with N-channel FET's M10, and M11 and M12 and P-channel load FET's M23 and M24; and a pair of N-channel transfer gate FET's M21 and M22 coupling the differential amplifier and the flip-flop. The above comparator circuit can be operated with clock pulses $\phi_1$ and $\phi_2$ shown in FIG. 5. Up to a time point $t_1$, the clock $\phi_1$ has a high voltage while the clock $\phi_2$ has a ground potential. Accordingly, FET's M21 and M22 are conducting, while FET's M23, M24 and M12 are non-conducting. Therefore, output voltages from the differential amplifiers are applied to the output terminals 5' and 6' through FET's M21 and M22. From the time point $t_1$, the clock $\phi_1$ starts to change towards a ground potential while the clock $\phi_2$ starts to change towards a high level so that FET's M21 and M22 are turned on and FET's M23, M24 and M12 are turned off. The flip-flop is thereby activated to amplify a small voltage difference provided to the terminals 5' and 6', in the initial state, to a logic amplitude. It is necessary that this circuit is designed very carefully with respect to the falling time of the clock $\phi_1$ and the rising time of the clock $\phi_2$ for the following reasons. When the clock $\phi_1$ falls, the flip-flop and differential amplifier are disconnected from each other, and an electric current from a power source (+V) is supplied to the output terminals 5' and 6' through FET's M23 and M24 so that the electric potentials at the terminals 5' and 6' vary. There is the possibility that a voltage difference to be amplified fluctuates greatly due to deviation in the electric characteristics of the FET's M23 and M24. In order to prevent the above phenomenon, it is necessary that the voltage comparator circuit is designed in such a manner that the rising of the clock $\phi_2$ exactly coincides with the falling of the clock $\phi_1$. The gate voltage in transfer gates FET's M21 and M22 included in the signal paths vary at a voltage amplitude equal to a power source voltage (+V). Consequently, when the voltages in these two transfer gates FET's M21 and M22 are not coincident with each other, a difference between the voltages in the terminals 5' and 6' is greatly influenced thereby due to the capacitance coupling. This causes an increase in an offset voltage in the comparison of voltages. This circuit, which has the above-described drawbacks, requires two clock signals $\phi_1$ and $\phi_2$. Accordingly the circuit has a complicated construction, occupies a larger area, and consumes a larger amount of electric power.

The possibility of omitting the FET's M21 and M22 will now be discussed. Assume that the voltage comparator circuit is operated with these transistors omitted and the differential amplifier and the flip-flop are directly coupled, and that the output terminal 5' has the ground potential. The input potentials at the FET's M2' and M3' are between the power source voltage and ground potential, and both of the FET's M2' and M3' are in an ON-state, the electric potential at the commonly connected sources at a node A is higher than the ground potential. However, the voltage at a drain of the FET M3', which is connected to the output terminal 5', has a ground potential. Therefore, an electric current flows from the node A to the output terminal 5' through the FET M3' reducing the electric potential at the node A. Since the mutual conductance of the input transistor of the amplifier is usually set to a high value, the voltage at the node A also decreases to a ground potential. As a result, an electric current flows to FET M2' at a higher rate to cause the drain voltage in FET M2' to also decrease to a ground potential. This shows that FET's M21 and M22 are indispensable to the circuit.

Therefore, it can be said that the circuit shown in FIG. 4 is improved to a certain extent with respect to the elimination of in-phase noise. However, the circuit has a large number of elements and a low operational stability.

The present invention will now be described with reference to FIG. 6, and FIG. 7.

Figure 3:
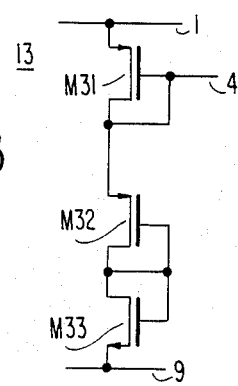
FIG. 3 shows an example of a circuit of a bias voltage supplying circuit.
Figure 6:
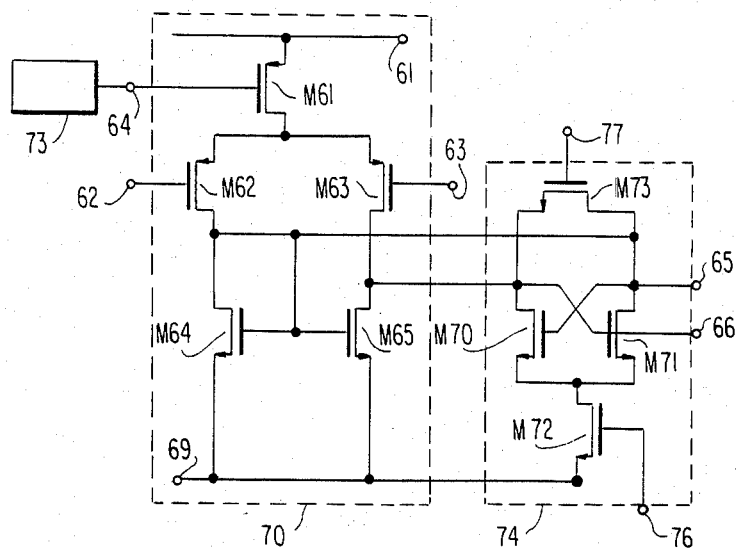
FIG. 6 shows a circuit of an embodiment of the present invention.

In this embodiment, as shown in FIG. 6, signal input FET's M62 and M63 are of P-channel FET's, and a drain of a P-channel FET M61 is connected to the sources of FET's M62 and M63. A source of FET M61 is connected to a positive power terminal 61. A bias voltage supplying circuit 73 which may be structured as shown in FIG. 3, is connected to a gate of the FET M61 through a node 64 to apply a constant voltage thereto, and thereby operate the FET M61 as a constant current circuit.

The gate electrodes of the n-channel FET's M64 and M65 are connected to a drain electrode of the FET m64, and drain electrodes of the FET's M64 and M65 to a drain of an FET M62. Thus, a C-MOS differential amplifier circuit having a load of a current mirror type is constructed. From the drain electrodes of the FET's M64 and M65 are derived output terminals 65 and 66. A gate of an N-channel FET M70 and a drain of an N-channel FET M71 are connected to the output terminal 65, and a drain of an FET M70 and a gate of an FET M71 are connected to the output terminal 66, thereby forming a cross-coupling. The sources of the FET's M70 and M71 are connected to the drain of an N-channel FET M72. A source of the FET M72 is connected to a negative power terminal 69, and a pulse shown in FIG. 7 with a reference symbol $V_{76}$, is supplied to a gate of the FET M72 through a terminal 76, to form a means for decreasing the voltage of commonly connected sources of the FET's M70 and M71. A source and a drain of an N-channel FET M73 are connected between the output terminals 65 and 66, and in response to a pulse shown with a reference symbol $V_{77}$ in FIG. 7 applied to a gate thereof, it forcibly equalizes potentials at the output terminals 65 and 66.

In the above circuit structure the P-channel FET's and N-channel FET's can all be replaced by the other. In such a case, the polarity of a power source voltage to be supplied between the terminals 61 and 69 is reversed to operate the circuit in the same manner.

Figure 7:
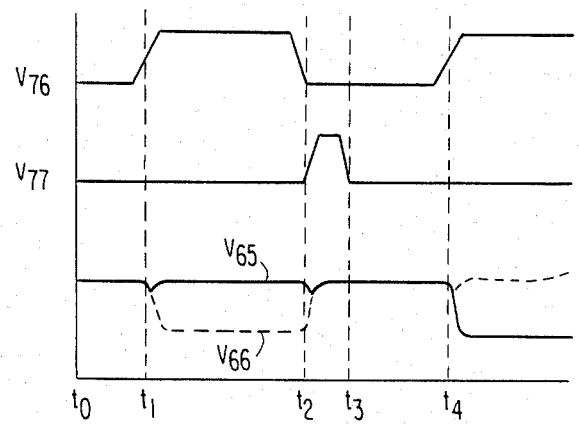
FIG. 7 is a diagram showing an operation of the circuit shown in FIG. 6 and the voltage wave-form of an output therefrom.

With reference to FIG. 7, operation of the circuit of FIG. 6 will be described.

At a time point $t_0$, neither the pulse $V_{76}$ nor the pulse $V_{77}$ is generated i.e. at the active level. Assume that a voltage at the input terminal 62 is slightly lower than that at the input terminal 63 at this time. An electric current then flows through the FET M62 at a little higher rate than the FET M63 so that a voltage at the output terminal 65 increases a little. On the other hand, an electric current flowing through the FET M65 decreases, while a gate voltage of the FET M65 increases. Accordingly, a voltage decreases that is more than 50 times as large as a normal input voltage difference is generated at the output terminal 66. At time point $t_1$, the clock potential $V_{76}$ is made active to turn on the FET M72. Consequently, the electric potential at the node 66 decreases, and the flip-flop is operated. If FET's M70 and M71 have the same electric characteristics, the FET M70, which has a higher gate voltage, is turned on first to cause the voltage of the output terminal 66 to decrease as shown in broken line with reference symbol $V_{66}$ in FIG. 7. On the other hand, the gate voltage of the FET M71 decreases earlier, so that electric current does not substantially flow therethrough. Namely, the initial voltage shown in full line with reference symbol $V_{65}$ in FIG. 7 is maintained. Since this flip-flop is operated in response to a difference between the voltages at the output terminals 65 and 66, it is not influenced by the fluctuations of an in-phase component. In order to set a final voltage on the low-voltage side of the output terminals 65 and 66 to a level lower than the threshold voltage of the FET's, it is desirable that quotients obtained by dividing the widths of channels of the FET's M70 and M71 by the respective lengths of the same channels are set to be more than five times as large as those obtained in the same manner as for the FET's M64 and M65. The parasitic capacitances associated to the output terminals 65 and 66 are different from each other. Namely, the gates of the FET's M64 and m65 are connected to the output terminal 65 but the output terminal 66 has no corresponding connection. When a rate at which the electric potential at the node 66 decreases has become far greater than a rate at which the voltage at the output terminal 65 decreases, the operation of the circuit would become unstable. Therefore, it is desirable that the ratio of the channel width to the channel length of the channels of the FETS M70 and M71 be less than half of that of the FET M72, and greater than the value determined in the same manner with respect to the FET's M61 and M62. According to the present invention, an electric current is constantly supplied from the P-channel FET M61 of the differential amplifier circuit 70, and the source of FET M62 has the highest electric potential. Thus, the high electric potential of the terminal 65 does not interfere with the potential at the terminal 66 through the FET's M62 and M63. In order to carry out a subsequent comparing operation with this voltage comparator circuit, it is necessary that the pulse $V_{77}$ shown in FIG. 7 is applied to the latch circuit 74. When the pulse $V_{76}$ is decreased in level the FET M72 is turned off, so that the electric current ceases flowing to the FET M70. As a result, the electric potential at the output terminal 66 increases to a level close to that determined by the differential amplifier 70. During this charging period, an electric current also flows at a high rate through the FET M65. Consequently, it takes much time to return the differential amplifier to the normal state. When the pulse $V_{76}$ is returned to zero at a time point $t_2$ with the pulse $V_{77}$ applied to the terminal 77 at the same time to turn on the FET M73, the output terminals 65 and 66 are short-circuited, and the voltage at the terminals 65 and 66 has a value equal to an averaged value of the voltages which had been applied to the two terminals 65 and 66 before they were short-circuited. Namely, the voltage in the output terminal 65 decreases. Consequently, the gate voltages at the FET's M64 and M65 decrease to cause the resistances thereof to increase, so that an amount of the electric current flowing to the ground decreases. Accordingly, the voltage comparator circuit with the FET M73 can return to the initial state at a speed more than several hundred times as fast as in the case where the above-mentioned operation is not carried out. Thus, a new comparing operation can be started immediately after a time point $t_3$ shown in FIG. 7, at which the pulse $V_{77}$ is returned to zero. Thus, comparing operations can be allowed to be repeated at a high speed.

Next, the explanation will be made on the case where the voltage at the input terminal 62 is somewhat higher than that at the input terminal 63.

In this case, the voltage between the gate and source of the FET M62 is lower than that of the FET M63, so that an amount of an electric current flowing through the FET M62 becomes smaller than that flowing through the FET M63. Accordingly, an amount of an electric current flowing through the FET M64 also decreases, so that the voltage at the output terminal 65 decreases. On the other hand, an amount of an electric current flowing through the FET M65 increases, while its gate voltage decreases. Therefore, the voltage at the output terminal 66 increases more than 50 times an input voltage difference. Here, when the pulse $V_{76}$ is applied to the terminal 76, the voltage at the node 65 decreases, so that the flip-flop starts its operation. The instant at which the flip-flop commences operation is $t_4$ shown in FIG. 7. Namely, the FET M72 is turned on first to cause the voltage in the output terminal 65 to decrease rapidly. As a result, the gate voltages at the FET M64 and M65 decrease to cause an amount of the electric current flowing through these two transistors to decrease. Consequently, the voltage at the output terminal 66 increases to a level equal to those of the source voltages of the FET's M62 and M63. On the other hand, the voltage at the output terminal 65 decreases.

An operation for returning the circuit to the initial state is carried out in the same manner as the similar operation carried out at the time point $t_2$. Namely, when the pulse $V_{77}$ is applied to the terminal 77 to turn on the FET M73, the levels of the voltages at the output terminals 65 and 66 become equal to an averaged or intermediate level of the two output voltages determined by the logic state. If the averaged voltage determined after the pulse $V_{77}$ is applied is lower than that determined before the pulse $V_{77}$ is applied, the resistance values of the FET's M64 and M65 increase, and an amount of an electric current flowing therethrough decreases as compared with that before the pulse $V_{77}$ is applied, so that a charging operation is accelerated. If the averaged voltage determined after the pulse $V_{77}$ is applied is higher than that determined before the pulse $V_{77}$ is applied, the resistance values of the mentioned transistors decrease, and an amount of an electric current flowing therethrough increases, so that a discharging operation is accelerated. Thus, the voltage comparator circuit returns to the initial state faster.

Figure 8:
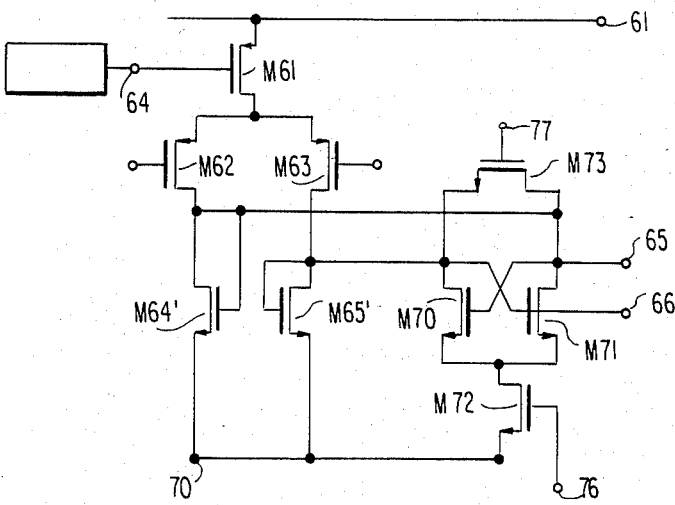
FIG. 8 shows a circuit of another embodiment of the present invention.

Another embodiment of the present invention will be described with reference to FIG. 8. In this embodiment, the load FET's M64 and M65 constituting a current mirror circuit in the embodiment shown in FIG. 6 are substituted by constant voltage type load FET's M64' and M65'. The drain and gate of N-channel FET M64' are connected to a common node, and also the drain and gate of FET M65' are connected in the same manner. The voltage comparator circuit in this embodiment is operated in the same manner as the embodiment shown in FIG. 6.

The present invention has been described on the basis of some embodiments but it is not limited to the above-described embodiments. For example, the current source and load in the differential amplifier circuit may be substituted by arbitrarily-selected elements. It is clear that, even when two types of conductive transistors in use are all replaced by the others with the polarity of the power source reversed without changing the construction of the circuit, a voltage comparator circuit having the same effect as mentioned above can be obtained.

I claim:

1. A comparator circuit comprising a first voltage terminal, a second voltage terminal, first and second input terminals, first to third nodes, a constant current source coupled between said first voltage terminal and said third node, said constant current source continuously generating a constant current, a first field effect transistor of a first conductivity type coupled between said first node and said third node, a second field effect transistor of said first conductivity type coupled between said second node and said third node, means for connecting a gate of said first field effect transistor to said first input terminal, means for connecting a gate of said second field effect transistor to said second input terminal, first load means coupled between said first node and said second voltage terminal, second load means coupled between said second node and said second voltage terminal, third and fourth field effect transistors of a second conductivity type having gates and drains cross-coupled at said first and second nodes and commonly connected sources, switching means coupled between the commonly connected sources of said third and fourth field effect transistors and said second voltage terminal, a first output terminal, a second output terminal, means for connecting said first output terminal to said first node and means for connecting said second output node to said second node, and control means for making said switching means non-conducting for a first period and conducting for a second period subsequent to said first period, wherein said constant current is divided into said first and second load means during said first period, and divided into said first and second load means and said third and fourth field effect transistors during said second period.

2. The circuit according to claim 1, further comprising short-circuiting means coupled between said first and second nodes for operatively short-circuiting therebetween.

3. The circuit according to claim 1, in which said first load means includes a fifth field effect transistor of said second conductivity type coupled between said first node and said second voltage terminal and having a gate coupled to said first node, and said second load means includes a sixth field effect transistor of said second conductivity type coupled between said second node and said second voltage terminal and having a gate coupled to said first node.

4. The circuit according to claim 3, in which said switching means includes a seventh field effect transistor of said second conductivity type coupled between said second voltage terminal and the commonly connected sources of said third and fourth transistors.

5. A voltage comparator circuit comprising first and second voltage terminals, a common node, a first field effect transistor of P-channel type coupled between said first voltage terminal and said common node, first and second nodes, means for biasing said first transistor in a constant current region, a second field effect transistor of P-channel type coupled between said common node and said first node, a third field effect transistor of P-channel type coupled between said common node and said second node, first and second input terminals, means for connecting a gate of said second field effect transistor to said first input terminal, means for connecting a gate of said third field effect transistor to said second input terminal, a fourth field effect transistor of N-channel type coupled between said first node and said second voltage terminal, a fifth field effect transistor of N-channel type coupled between said second node and said second voltage terminal, said fourth and fifth transistors continuously acting as load elements, sixth and seventh field effect transistors of N-channel type having gates and drains cross-coupled at said first and second nodes and commonly connected sources, an eighth field effect transistor of N-channel type coupled between the commonly connected sources of said sixth and seventh transistors and said second voltage terminal, means for supplying a gate of said eighth transistor with a first control signal, first and second output terminals, means for connecting said first node to said first output terminal and means for connecting said second node to said second output terminal, wherein said sixth and seventh transistors further amplify the levels at said first and second output terminals which have been amplified by said second and third transistors when said eighth transistor is conducting.

6. The circuit according to claim 5, further comprising a ninth field effect transistor of N-channel type coupled between said first and second nodes, and means for supplying a gate of said ninth transistor with a second control signal.

7. The circuit according to claim 5, in which gates of said fourth and fifth transistors are coupled to said first node.

8. The circuit according to claim 5, in which a gate of said fourth transistor is coupled to said first node and a gate of said fifth transistor is coupled to said second node.

9. A comparator circuit comprising a first voltage terminal, a first field effect transistor of a first conductivity type coupled between said first voltage terminal and a first node, bias means for biasing said first transistor to operate in a constant current region, a second field effect transistor of said first conductivity type coupled between said first node and a second node and having a gate supplied with a first input signal, a third field effect transistor of said first conductivity type coupled between said first node and a third node and having a gate supplied with a second input signal, a second voltage terminal, a fourth field effect transistor of a second conductivity type coupled between said second node and said second voltage terminal and having a gate connected to said second node, a fifth field effect transistor of said second conductivity type coupled between said third node and said second voltage terminal and having a gate connected to said second node, sixth and seventh field effect transistors of said second conductivity type having gates and drains cross-coupled at said second and third nodes and having commonly connected sources, an eighth field effect transistor of said second conductivity type coupled between said commonly connected sources and said second voltage terminal and a gate supplied with a first control signal, a ninth field effect transistor of said second conductivity type coupled between said second and third nodes and having a gate supplied with a second control signal, a first output terminal coupled to said second node, and a second output terminal coupled to said third node.

10. The comparator circuit according to claim 9, wherein the ratio of the width to the length of the channel of said sixth transistor and said seventh transistor is set to be more than five times as large as the ratio of the width to the length of the channel of said fourth transistor and fifth transistor.

11. The comparator circuit according to claim 9, wherein the ratio of the width to the length of the channel of said sixth transistor and seventh transistor is set to be less than half the ratio of the width to the length of said eighth transistor.

12. The comparator circuit according to claim 9, wherein said second control signal becomes active prior to a comparison operation.

13. The comparator circuit according to claim 9, wherein said first control signal becomes active after the levels at said second and third nodes are established.

14. A comparator circuit comprising a first voltage terminal, a first field effect transistor of a first conductivity coupled between said first voltage terminal and a first node, bias means for biasing said first transistor to operate in a constant current region, a second field effect transistor of said first conductivity type coupled between said first node and a second node and having a gate supplied with a first input signal, a third field effect transistor of said first conductivity type coupled between said first node and a third node and having a gate supplied with a second input signal, a second voltage terminal, a fourth field effect transistor of a second conductivity type coupled between said second node and said second voltage terminal and having a gate connected to said second node, a fifth field effect transistor of said second conductivity type coupled between said third node and said second voltage terminal and having a gate connected to said third node, sixth and seventh field effect transistors of said second conductivity type having gates and drains cross-coupled at said second and third nodes and having commonly connected sources, an eighth field effect transistor of said second conductivity type coupled between said commonly connected sources and said second voltage terminal and a gate supplied with a first control signal, a ninth field effect transistor of said second conductivity type coupled between said second and third nodes and having a gate supplied with a second control signal, a first output terminal coupled to said second node, and a second output terminal coupled to said third node.

15. The comparator circuit according to claim 14, wherein the ratio of the width to the length of the channel of said sixth transistor and seventh transistor is set to be more than five times as large as the ratio of the width to the length of the channel of said fourth transistor and fifth transistor.

16. The comparator circuit according to claim 14, wherein the ratio of the width to the length of the channel of said sixth transistor and seventh transistor is set to be less than half the ratio of the width to the length of said eighth transistor.

17. The comparator circuit according to claim 14, wherein said second control signal becomes active prior to a comparison operation.

18. The comparator circuit according to claim 14, wherein said first control signal becomes active after levels at said second and third nodes are established.

* * * * *

UNITED STATES PATENT AND TRADEMARK OFFICE
CERTIFICATE OF CORRECTION

PATENT NO. : 4,511,810

DATED : April 16, 1985

INVENTOR(S) : Akira YUKAWA

It is certified that error appears in the above-identified patent and that said Letters Patent is hereby corrected as shown below:

Column 1, line 16, after "though" delete "two" (first occurrence and insert --this--;
          line 28, "voltage" should be --voltages--;
          line 34, "inphase" should be --in-phase--.

Column 2, line 28, "pairs" should be --pair--;
          line 65, after "tial" insert --input--.

Column 3, line 31, "wave forms" should be --waveforms--;
          line 36, "wave-form" should be --waveform--.

Column 4, line 1, "structural" should be --structured--;
          line 25, "inphase" should be --in-phase--;
          line 52, "on" should be --off--;
          line 52, "off" should be --on--.

Column 5, line 2, "voltage" should be --voltages--;
          line 55, "n-channel" should be --N-channel--;
          line 57, "m64" should be --M64--.

UNITED STATES PATENT AND TRADEMARK OFFICE
CERTIFICATE OF CORRECTION

PATENT NO. : 4,511,810

DATED : April 16, 1985

INVENTOR(S) : Akira Yukawa

It is certified that error appears in the above-identified patent and that said Letters Patent is hereby corrected as shown below:

Column 6, line 54, "m65" should be --M65--;
           line 62, "FETS" should be --FET's--.

Signed and Sealed this

Twenty-fifth Day of November, 1986

*Attest:*

DONALD J. QUIGG

*Attesting Officer*      *Commissioner of Patents and Trademarks*